United States Patent
Bear et al.

(10) Patent No.: US 9,838,033 B1
(45) Date of Patent: Dec. 5, 2017

(54) ENCODER SUPPORTING MULTIPLE CODE RATES AND CODE LENGTHS

(71) Applicant: WESTERN DIGITAL TECHNOLOGIES, INC., Irvine, CA (US)

(72) Inventors: Jake Bear, Lakeside, CA (US); Dillip K. Dash, San Diego, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/396,366

(22) Filed: Dec. 30, 2016

(51) Int. Cl.
| | |
|---|---|
| H03M 5/14 | (2006.01) |
| H03M 7/40 | (2006.01) |
| H03M 7/30 | (2006.01) |
| H03M 13/11 | (2006.01) |
| H03M 13/00 | (2006.01) |

(52) U.S. Cl.
CPC ........... *H03M 7/40* (2013.01); *H03M 7/6011* (2013.01); *H03M 7/6058* (2013.01); *H03M 13/11* (2013.01); *H03M 13/611* (2013.01)

(58) Field of Classification Search
CPC ............... H03M 5/145; H03M 13/152; H03M 13/2903; H03M 13/11; H03M 13/116; H03M 13/1194; H03M 13/1565; H03M 13/1595; H03M 13/2906; H03M 13/2909; H03M 13/2918; H03M 13/2957; H03M 13/618; H03M 13/6356
USPC ........................................ 341/51, 74, 94.106
See application file for complete search history.

(56) References Cited

U.S. PATENT DOCUMENTS

| | | | | |
|---|---|---|---|---|
| 7,178,080 | B2* | 2/2007 | Hocevar | H03M 13/1114 714/752 |
| 7,530,002 | B2* | 5/2009 | Lee | H03M 13/1137 714/752 |
| 8,914,705 | B1* | 12/2014 | Zeng | H03M 7/28 341/58 |
| 2009/0313523 | A1* | 12/2009 | Huang | H03M 13/116 714/752 |
| 2011/0078540 | A1* | 3/2011 | Hu | G11B 20/1833 714/763 |
| 2011/0154168 | A1* | 6/2011 | Lee | H03M 13/116 714/801 |
| 2013/0147645 | A1* | 6/2013 | Wang | H03M 13/152 341/94 |
| 2015/0381204 | A1* | 12/2015 | Zhang | H03M 13/116 714/773 |

* cited by examiner

*Primary Examiner* — Linh Nguyen
(74) *Attorney, Agent, or Firm* — McDermott Will & Emery LLP

(57) ABSTRACT

An encoder that supports multiple code rates and code lengths is disclosed. A shift register utilized by the encoder may be scaled in size based on a selected code rate or code length. The shift register shifts a bit series for the matrix without requiring fixed feedback points within the register. The sizes of the matrix and bit series are based on the selected code rate or code length, and the encoder loads the bit series into a first portion of the shift register, and a division of the bit series into a second portion of the shift register located adjacent to the first portion. The encoder periodically repopulates the shift register from memory to simulate circular shifting of the bit series without feedback points. Accordingly, complexity of the encoder is reduced.

22 Claims, 7 Drawing Sheets

ENCODER SUPPORTING MULTIPLE CODE RATES AND CODE LENGTHS

TECHNICAL FIELD

This disclosure relates to data storage systems, and encoders supporting multiple code rates.

BACKGROUND

Non-volatile memory arrays often have limited endurance. The endurance of the memory array is typically contingent on usage pattern and wear. In addition, the endurance depends on a type of the non-volatile memory array used. For example, memory arrays with multi-level cell (MLC) NAND media typically have a lower endurance than memory arrays with single-level cell (SLC) NAND media. To protect user data stored to memory arrays from corruption, which may be caused by a diminished endurance, parity data may be generated and stored along with user data to facilitate error detection and/or correction. Generation of parity data may be time consuming and resource intensive. Accordingly, it is desirable to provide more efficient mechanisms for generating parity data.

SUMMARY

A system and method of encoding using multiple code rates and code lengths. According to some implementations, the method comprises loading a predetermined bit series of a matrix into a first portion of a shift register, and a first division of a plurality of divisions of the predetermined bit series into a second portion of the shift register adjacent the first portion, performing a predetermined number of encoding iterations, wherein each encoding iteration comprises executing an operation on a data payload using bit values in the first portion of the shift register and shifting contents of the first and second portions of the shift register one position, reloading the second portion of the shift register with a next division of the plurality of divisions of the predetermined bit series, and repeating the performing and reloading steps until the predetermined number of encoding iterations has been performed with each of the plurality of divisions of the predetermined bit series loaded into the second portion of the shift register to generate a codeword from the data payload.

According to some implementations, a data encoding system comprises a controller configured to identify a predetermined code size for host data received from a host system, a memory storing at least a portion of a matrix for the predetermined code size, a shift register, and a controller. In these implementations, the controller is configured to load a predetermined bit series of the matrix into a first portion of the shift register, and a first division of a plurality of divisions of the predetermined bit series into a second portion of the shift register adjacent to the first portion, perform a predetermined number of encoding iterations, wherein each encoding iteration comprises executing an operation on a data payload using bit values in the first portion of the shift register and shifting contents of the first and second portions of the shift register one position, reload the second portion of the shift register with a next division of the plurality of divisions of the predetermined bit series, and repeat the perform and reload steps until the predetermined number of encoding iterations has been performed with each of the plurality of divisions of the predetermined bit series loaded into the second portion of the shift register to generate a codeword from the data payload.

According to some implementations, a non-transitory machine-readable medium comprises instructions thereon that, when executed, cause an encoding module to perform a method. In these implementations, the method comprises loading a predetermined bit series of a matrix into a first portion of a shift register, and a first division of a plurality of divisions of the predetermined bit series into a second portion of the shift register adjacent the first portion, performing a predetermined number of encoding iterations, wherein each encoding iteration comprises executing an operation on a data payload using bit values in the first portion of the shift register and shifting contents of the first and second portions of the shift register one position, reloading the second portion of the shift register with a next division of the plurality of divisions of the predetermined bit series, and repeating the performing and reloading steps until the predetermined number of encoding iterations has been performed with each of the plurality of divisions of the predetermined bit series loaded into the second portion of the shift register to generate a codeword from the data payload.

According to some implementations, a system comprises a means for loading a predetermined bit series of a matrix into a first portion of a shift register, and a first division of a plurality of divisions of the predetermined hit series into a second portion of the shift register adjacent the first portion, a means for performing a predetermined number of encoding iterations, wherein each encoding iteration comprises executing an operation on a data payload using bit values in the first portion of the shift register and shifting contents of the first and second portions of the shift register one position, a means for reloading the second portion of the shift register with a next division of the plurality of divisions of the predetermined bit series, and a means for repeating the performing and reloading steps until the predetermined number of encoding iterations has been performed with each of the plurality of divisions of the predetermined bit series loaded into the second portion of the shift register to generate a codeword from the data payload.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

Systems and methods that embody the various features of the subject technology will be described with reference to the following drawings, in which.

DETAILED DESCRIPTION

Figure 1:
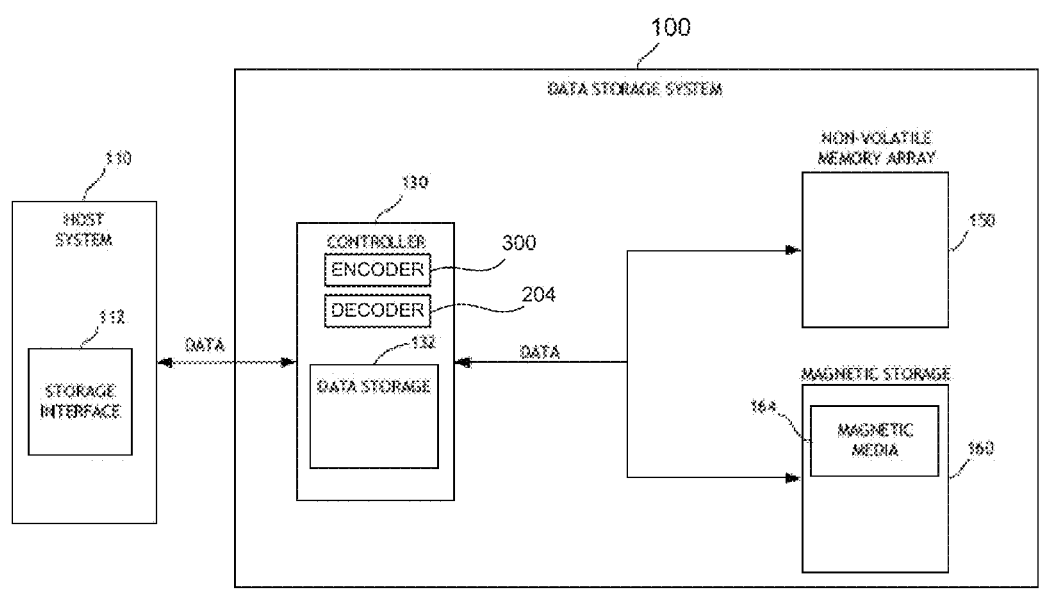
FIG. 1 illustrates an example data storage system that implements an encoder supporting multiple code rates and code lengths according to aspects of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

Data storage systems, such as solid state drives, may include one or more controllers coupled with one or more non-volatile memory arrays. Depending on the type of non-volatile memory array used, stored data may be subject to corruption as a result of, for example, read/write disturbs, loss of data retention, and/or loss of endurance. Data storage systems may utilize one or more error correction or error coding mechanisms to detect and/or correct errors in the stored data. One such mechanism may determine parity data when writing user data. Parity data may be stored, for example, in a memory array. When stored user data is retrieved, parity data may be utilized to determine the integrity of the retrieved user data. If one or more errors are detected in the retrieved user data, such errors may be corrected.

Generation of parity data may involve considerable system overhead, such as processing time overhead, system resources overhead, and/or system components overhead (e.g., necessity to use additional hardware, firmware, etc.). Furthermore, storing parity data (e.g., in a memory array) may reduce memory space available for storage of user data. Accordingly, it may be advantageous for a data storage system to support different error code rates, code lengths, and/or different coding throughput speeds. For example, a data storage system may encode stored data using a higher code rate, so that less parity data is generated and stored, when non-volatile memory is early in the lifecycle and thus has sufficient retention and/or endurance. As non-volatile memory wears out over time, the data storage system may switch to lower code rates such that more parity data is generated to protect user data from errors. However, supporting multiple code rates, lengths, and/or throughput speeds may require adding and/or duplicating system components (hardware, firmware, etc.).

Example implementations of the subject technology are directed to an encoder supporting multiple code rates. For example, the encoder may be configured to use a single shift register to support various code rates and/or code lengths. The encoder may further support multiple error coding throughput speeds by, for example, utilizing parallel computation techniques. In other words, the architecture of the encoder may be scalable and/or flexible. Accordingly, encoding efficiency and, consequently, data storage system performance may be increased without a substantial increase in the number and/or size of system components data encoding.

FIG. 1 illustrates an example data storage system 100 that implements an encoder supporting multiple code rates and code lengths according to aspects of the subject technology. As is shown, data storage system 100 (e.g., a solid-state drive) includes a controller 130 and a non-volatile memory array 150 and, optionally, a magnetic storage 160 which comprises magnetic media 164. The non-volatile memory array 150 may comprise non-volatile memory, such as flash integrated circuits, Chalcogenide RAM (C-RAM), Phase Change Memory (PC-RAM or PRAM), Programmable Metallization Cell RAM (PMC-RAM or PMCm), Ovonic Unified Memory (GUM), Resistance RAM (RRAM), NAND memory (e.g., single-level cell (SLC) memory, multi-level cell (MILC) memory, or any combination thereof), NOR memory, EEPROM, Ferroelectric Memory (FeRAM), Magnetoresistive RAM (MRAM), other discrete NVM (non-volatile memory) chips, or any combination thereof. The data storage system 100 may further comprise other types of storage.

Controller 130 may be configured to receive data and/or storage access commands from a storage interface module 112 (e.g., a device driver) of a host system 110. Storage access commands communicated by the storage interface 112 may include write data and read data commands issued by the host system 110. Read and write commands may specify a logical address (e.g., logical block addresses or LBAs) used to access the data storage system 100. Controller 130 may execute the received commands in the non-volatile memory array 150.

Data storage system 100 may store data communicated by the host system 110. In other words, the data storage system 100 may act as memory storage for the host system 110. To facilitate this function, controller 130 may implement a logical interface. The logical interface may present to the host system 110 data storage system's memory as a set of logical addresses (e.g., contiguous address) where user data may be stored. Internally, controller 130 may map logical addresses to various physical locations or addresses in the non-volatile memory array 150 and/or other storage modules. Controller 130 includes, among other things, a data storage memory 132, an encoder 300, and a decoder 204. Controller 130 is configured to store data in and retrieve data from the non-volatile memory array 150, determine integrity of data retrieved from the non-volatile memory array, perform, if necessary, error correction of retrieved data, and perform transfer of data between the data storage system 100 and the host system 110.

Figure 2:
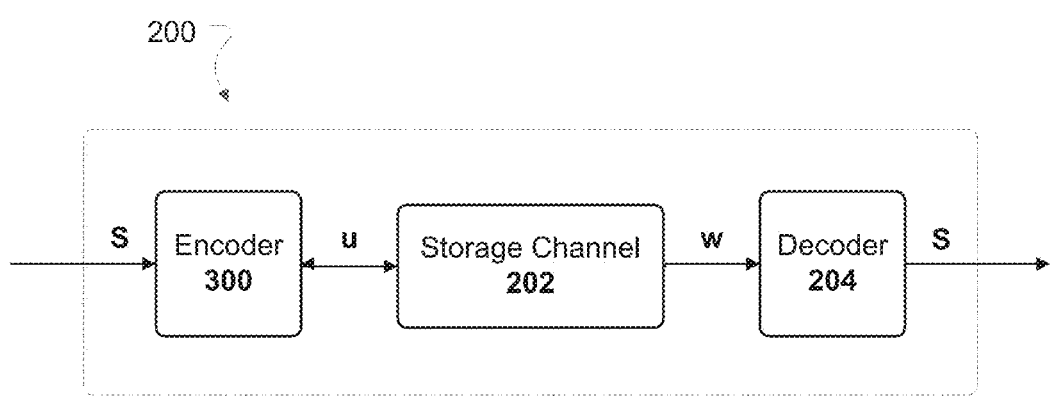
FIG. 2 depicts an exemplary encoder, storage channel, and decoder for the encoding, transmission, and decoding of data according to aspects of the subject technology.

FIG. 2 depicts an exemplary encoder 300, storage channel 202, and decoder 204 for the encoding, transmission, and decoding of data according to one aspect of the subject technology. Encoder 300 may process an input data A to produce a codeword u from a data payload s. Codeword u may include a user payload appended by error correction data. Encoder 300 may encode a user payload s using, for example, a generator matrix as explained further below. Codeword u may be transmitted to a storage channel 202 for storage, and then at a later time to decoder 204. Decoder 204 may perform data decoding operations using, for example, a parity check matrix, to reconstruct data payload S. As part of decoding operations, decoder 204 may attempt to reconstruct the original word s={$s_1, s_2, \ldots s_n$} from a received word w={$w_1, w_2, \ldots w_n$}. Received word w may include soft values (unverified values) for $w_1, w_2, \ldots w_n$ provided from, for example, a channel detector (for example, a soft-output Viterbi detector). Once codeword u has been reconstructed, decoder 204 may include a channel decoder for removing the redundant error correction data to produce original data input A.

In one or more example implementations, an encoder may utilize low-density parity-check (LDPC) linear block codes for generation of codewords. LDPC codes may be generated using a generator matrix G according to GK×N, where K=N−M corresponds to the number of information units or bits per codeword, which correspond to user data. Accordingly, M=n−k corresponds to the number parity bits. The LDPC encoder generates a codeword u=($u_0, u_1, \ldots, u_{N-1}$) from a user data vector v=(v0, v1, ..., vk−1) via following matrix multiplication:

$$v = u \times G \quad (1)$$

A generator matrix of an LDPC coder may produce systematic codes if the encoded codewords include the original user data bits followed by N−K parity check bits. Such generator matrix may be represented as:

$$G_{K \times N} = [I_{K \times K} | Q_{K \times (N-K)}] \quad (2)$$

For LDPC codes, Q submatrix of the generator matrix G is generally a high density matrix, and I submatrix is a k×k identity matrix. In one or more example implementations, the generator matrix G used for Quasi-Cyclic LDPC (QC-LDPC) encoding may have the following form:

$$G_{QC} = \begin{bmatrix} I & 0 & \cdots & 0 & G_{1,1} & G_{1,2} & \cdots & G_{1,m} \\ 0 & I & \cdots & 0 & G_{2,1} & G_{2,2} & \cdots & G_{2,m} \\ \vdots & \vdots & \ddots & \vdots & \vdots & \vdots & \ddots & \vdots \\ 0 & 0 & \cdots & I & G_{n-m,1} & G_{n-m,2} & \cdots & G_{n-m,m} \end{bmatrix} = [I_{(n-m)p} | Q] \quad (3)$$

where I is a p×p identity matrix, 0 is a p×p zero matrix, $G_{i,j}$ for 1≤i≤n−m and 1≤j≤m is a p×p circulant, and n=N/p and m=M/p. In p×p circulant matrix $G_{i,j}$ row number y is rotated to the right by one as compared to row number y−1. In one or more example implementations, code rate for QC-LDPC encoding may be defined as:

$$R = 1 - \frac{M}{N} = 1 - \frac{m}{n} \quad (4)$$

In one or more example implementations, when systematic LDPC codes are used, multiplication by a systematic portion of the generator matrix $G_{QC}$ (e.g., $I_{(n-m)p}$) may be dispensed with. In one or more example implementations, non-systematic portion Q of the generator matrix is not a low-density matrix. Still, matrix Q may be follow QC format (e.g., be circulant). Further, user data bits of a data payload may be divided into k (or n−m) segments:

$$s = \{s_1, s_2, s_3, \ldots, s_{n-m}\} \quad (5)$$

where $s_j$ is a jth subsegment of user data of size P (e.g., P bits). In one or more example implementations, $g_{i,j}$ may correspond to the first row of $G_{i,j}$ matrix and $h_{i,j}$ may correspond to the first column of $G_{i,j}$ matrix. In addition, $g_{i,j}^{(f)}$ may correspond to $g_{i,j}$ right-shifted by f and $h_{i,j}^{(f)}$ may correspond to $h_{i,j}$ right-shifted by f. Jth segment of parity data with size of P bits may be represented as:

$$Q_j = s_1 \times G_{1,j} = s_{1,j} + s_2 G_{2,j} + \ldots + s_{n-m} G_{n-m,j} \quad (6)$$

Figure 3:
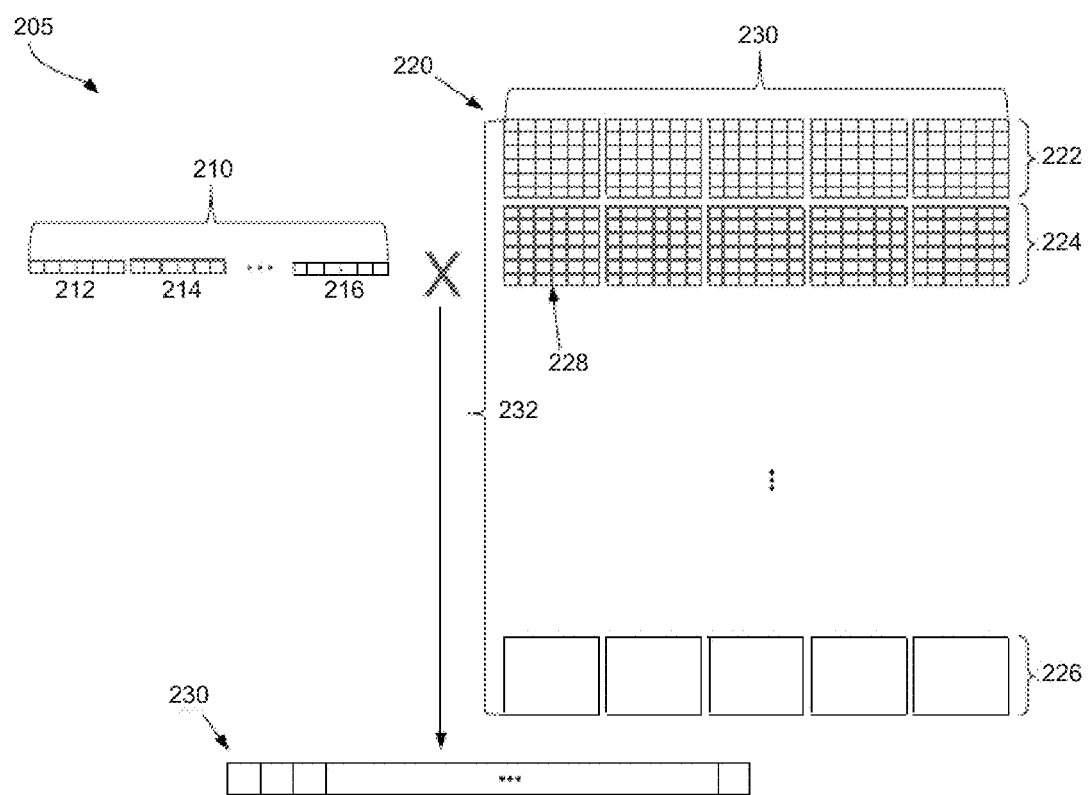
FIG. 3 illustrates example encoding performed by an example encoder according aspects of the subject technology.

FIG. 3 illustrates example encoding performed by an example encoder according to one aspect of the subject technology. In one or more example implementations, matrix multiplication is performed by controller 130, utilizing data storage memory 132 and encoder 300. Row 210 represents a segment of user data having length k. This segment comprises subsegments 212, 214, ..., 216 having length P, where P is an integer (e.g., 128, 256, 512, 1024, etc.). Matrix 220 represents generator matrix C. In one or more example implementations, matrix 220 may correspond to matrix Q of equation (3). Matrix 220 may be divided into a plurality of submatrices 228, which may be, for example, of size P×P. The number of submatrices 228 along the column dimension 230 of matrix 220 may be, for example, n−k, (n−k)/P, and so on. The number of submatrices 228 along the row dimension 232 of matrix 220 may be, for example, k, k/P, and so on. In one or more example implementations, there are m submatrices 228 along the column dimension 230 of matrix 220.

In one or more example implementations, encoding 205 may include the following operations. User data 210 subsegment 212 may be multiplied by submatrices 228 in row 222 in order to determine:

$$Q_j = s_1 G_{1,j} \text{ for } j = \{0, m-1\} \quad (7a)$$

User data 210 subsegment 214 may be multiplied by submatrices 228 in row 224 in order to determine:

$$Q_j = Q_j + s_2 G_{2,j} \text{ for } j = \{0, m-1\} \quad (7b)$$

These multiplication operations may be continued and $Q_j$ of equation (6) may be determined as follows:

$$Q_j = Q_j + s_{n-m} G_{n-m,j} \text{ for } j = \{0, m-1\} \quad (7c)$$

Finally, user data 210 subsegment 216 may be multiplied by submatrices 228 in row 226 in order to determine the final value of $Q_j$. The result may be saved in a row vector 230.

Figure 4:
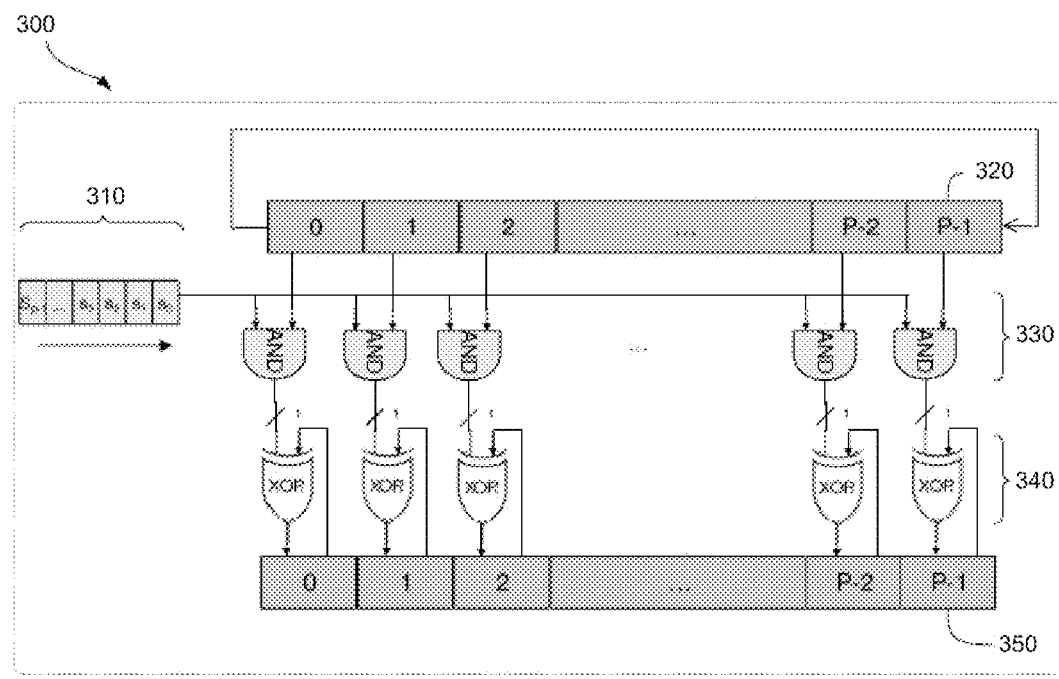
FIG. 4 illustrates a block diagram of an example portion of an example encoder 300 according to aspects of the subject technology.

FIG. 4 illustrates a block diagram of an example portion of an example encoder 300 according to one aspect of the subject technology. The encoder 300 may include an input register 310 and a shift register 320, logic circuitry 330 and 340, and output register 350. Register 310 may be configured to store a subsegment of user data (e.g., of size p). Register 320 may be configured to store a row of a submatrix 228 (e.g., of size 1×p) of the matrix G. In one When encoder 300 is configured to perform QC-LDPC encoding, matrix (7 may be a circulant matrix and submatrix 228 may be circulant. Accordingly, shifting and/or rotating (e.g., to the left or the right) the content of register 320 may produce a next row of the submatrix. As a result, only one row of the submatrix may be stored in the register 320 for performing the multiplication $s_i \times G_{i,j}$ of equation (6). Logic circuitry 330 and 340 (e.g., comprising logic gates) may be configured to perform multiplication operations such as the multiplication $s_i \times G_{i,j}$ of equation (6). In one or more example implementations, AND and XOR gates may be utilized. In other example implementations, any other suitable combinations of logic gates may be used, such as NAND, OR, NOR, etc. Result register 350 may be configured to store the result of the multiplication.

In one or more example implementations, the encoder 300 may determine $s_i \times G_{i,j}$ as follows. A row $g_{i,j}$ of the submatrix is loaded into the register 320 and next user subsegment (e.g., of size p bits) is loaded in the register 310. Every computational cycle one bit $s_i$ of register 310 may be fed to as input into the respective logic gates 330. This may be accomplished by right or left shifting the register 310. The result of the multiplication by $s_i$ is computed and stored in the register 350, which may indicate a completion of a computational cycle. In one or more example implementations, a computational cycle may correspond to a system clock cycle. At the start of the next computational cycle, the contents of the register 320 may be shifted by one, which results in loading the next row of the submatrix. Then, the next bit $s_i$ from register 310 is fed as input to the logic circuitry 330, and the foregoing process is repeated. In one or more example implementations, the contents of the register 320 are shifted by one every computational cycle. It may take a total of P computational cycles to perform the operation $s_i \times G_{i,j}$. At the completion of P cycles, the encoder 300 may compute $s_i \times G_{i+1,j}$ by loading a row $g_{i+1,j}$ of the next submatrix into the register 320. As is illustrated in FIG. 4, the encoder 300 comprises three registers having size P, P logic gates 330 (e.g., AND gates), and P logic gates 340 (e.g., XOR). The encoder 300 may be referred to as shift-register-adder-accumulator (SRAA).

The subject technology may provide a solution that accommodates multiple LDPC codes with different code rates (for example, 0.8333~0.9375) with a complexity comparable to a decoder implementation that accommodates only a single LDPC code (encoder/decoder). The subject technology may be intended to be used in products using different flash chips with different raw error rates. This way, an ASIC used to implement the controller, encoder, and decoder aspects may be lot more versatile than single LDPC code implementations.

Encoder 300 generates an encoded codeword u of p bits. In one or more implementations, codeword u includes an encoded data block generated from the data payload and ECC information (e.g., parity bits). In an example using a code rate of 0.8750, the encoded block size of may be 4608 symbols (N=4608) with 4032 data bits (K=4032) and 576 parity bits (M=576).

As the code rate varies, the targeted LDPC code lengths may remain constant (for example, 4608 bits) due to a format requirement. For example, five code rates may be selected to be implemented. As described previously, a LDPC code parity-check matrix may be comprised of circulants. Table A provides information for generating a parity-matrix based on code rate. The "row weight" parameter indicates how many circulants are included in a row of a corresponding parity-check matrix, further, and column weight indicates how many rows of circulants may be included in a parity-check matrix. The "circulant size" parameter indicates the number of rows in any given circulant, and, consequently, the number of non-null values of the identity matrix comprising the circulant. Different codes may have different circulant sizes and different row weights.

TABLE A

| Code name | Length | Rate | User Payload | Circulant size | Column weight | Row weight |
|---|---|---|---|---|---|---|
| POR4 | 4608 | 0.8333 | 3840 | 192 | 4 | 24 |
| POR5 | 4608 | 0.8750 | 4032 | 144 | 4 | 32 |
| POR6 | 4608 | 0.8889 | 4096 | 128 | 4 | 36 |
| POR7 | 4608 | 0.9167 | 4224 | 96 | 4 | 48 |
| POR8 | 4608 | 0.9375 | 4320 | 72 | 4 | 64 |

In one or more example implementations, any number of encoders 300 may be utilized in order to improve throughput associated with the computation of parity data. In one or more example implementations, an LDPC encoder comprising, for example, an encoding module having five encoders 300 configured to compute parity data associated with user data in parallel may still provide throughput below a target throughput. For instance, the throughput in one or more example implementations may be about 100 MBytes/s when clock frequency of about 800 MHz is used. Many encoding modules may be needed to achieve higher throughput. For example, 80 or more encoding modules may be needed to achieve the throughput of about 8 GBytes/s or higher, with each encoding module having five encoders 300. In such configuration, the overall logic may comprise multiple million(s) of logic gates and use a large amount of buffer memory.

Figure 5A:
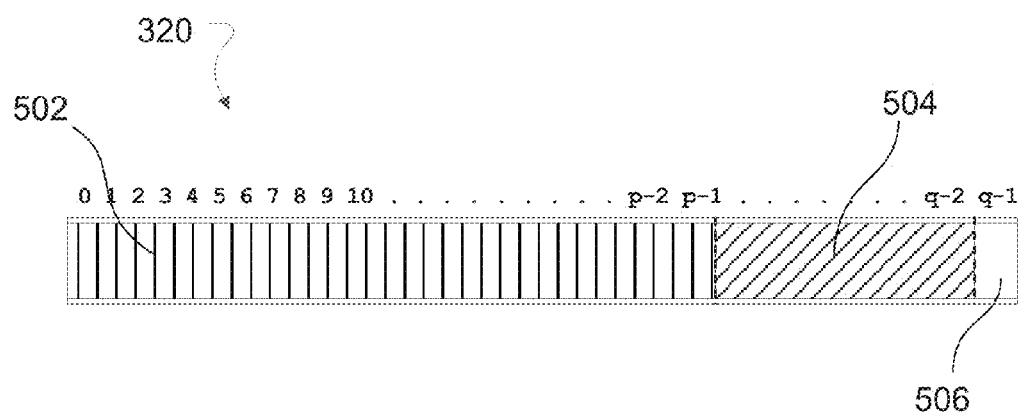
FIGS. 5A and 5B illustrate block diagrams of an example shift register for supporting multiple code rates and code lengths according to aspects of the subject technology.
Figure 5B:
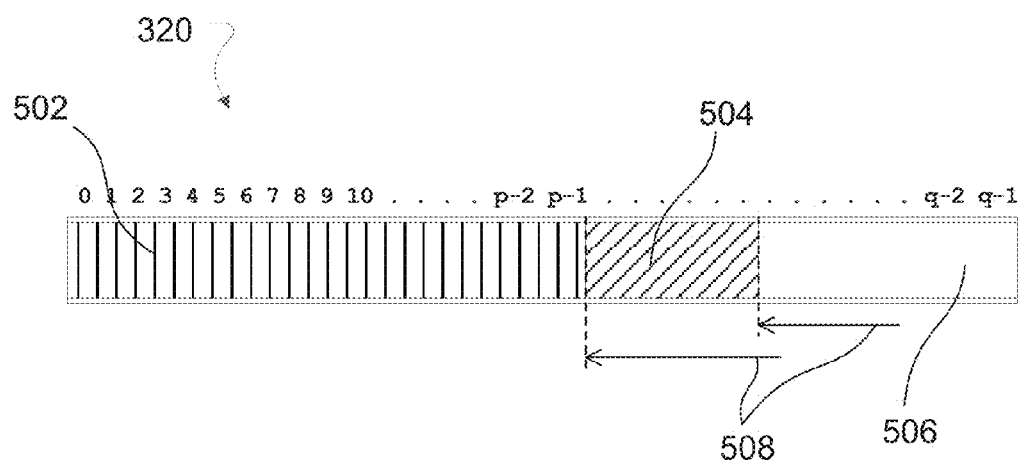

FIGS. 5A and 5B illustrate block diagrams of an example shift register 320 for supporting multiple code rates and code lengths according to various aspects of the subject technology. In addition to supporting different code rates as described above, shift register 320 may also be configured to support different code lengths. Accordingly, the subject technology provides an improvement over encoders that utilize registers of a fixed bit size by providing a variation of code rates and code lengths without requiring a different sized shift register for each code rate or code length.

In one or more implementations, the bit size q of shift register 320 may be larger than the largest expected bit stream to be loaded within shift register 320. As depicted in FIG. 5A, shift register 320 is divided into two or more portions. Each portion is sized based on the code length, and circulant size and row weight of the matrix used to generate a codeword u. A first portion 502 corresponds to the matrix size used to generate codeword u, and a second portion 504 is used to facilitate the simulation of rotationally shifting the bits loaded in the first portion as described below.

In LDPC encoding, shift register 320 continuously shifts during matrix multiplication. Shift register 320 may also be a rotating shift register. However, because first portion 502 is smaller than the bit size of shift register 320, the bits that shift out of first portion 502 are rotated to the opposing end of the shift register and are not rotated back into first portion 502. To address the operability of the shift register, the subject technology pre-loads a second portion 504, adjacent to first portion 502, with bits expected to be shifted out of first portion 502 during the shifting operations. As the bits are shifted out of first portion 502, the bits from second portion 504 are shifted into first portion 502, simulating a rotational shift register of the size of first portion 502.

First portion 502 may store one or more rows of one or more submatrices 228, for a total of p bits. For example, first portion 502 may have a bit size of 1600 when the G matrix for the selected code rate has a circulant size of 400 bits a row weight of 4. In one or more implementations, second portion 504 is pre-loaded with a first division of the p bits to be loaded in first portion 502 and shifted. Encoder 300 may divide the predetermined bit series of p size into equal divisions based on, for example, circulant size. The size of second portion 504 may be equal to the size of a division.

Encoder 300 loads a predetermined bit series of the matrix into first portion 502. A first division of a plurality of divisions of the predetermined bit series is loaded into second portion 504. A predetermined number of encoding iterations are performed, with each encoding iteration executing one or more operations on the data payload using bit values in the first portion of the shift register and shifting contents of the first and second portions of the shift register one position. The operations may be ECC encoding operations and/or the matrix operations described above. After a number of iterations equal to the size of the division are performed, second portion 504 is reloaded with a next division of the plurality of divisions of the predetermined bit series, and the steps are repeated until the predetermined number of encoding iterations has been performed with each of the plurality of divisions of the predetermined bit series, and a codeword is generated.

In some implementations, the bit size q of shift register 320 may equal the bit size p of the submatrices used to encode the data payload, and a second portion 504 will not be needed to rotationally shift first portion 502; i.e., shift register 320 will operate as first portion 502. However, in many situations, the total number q of bit positions in shift register 320 will be larger than the total number of bit positions used to accommodate first portion 502 and second portion 504. In this regard, shift register 320 may include a third portion 506. The bit size of third portion 506 is the total bit size of the shift register 320 less the bit size of the first portion and the bit size of the second portion.

In one example, the size of each circulant of a generator matrix may be 400 bits, and the matrix may have a row weight of 4. Accordingly, the size of the predetermined bit series to be loaded may be 1600 bits. The size of first portion 502 may then be set to 1600 bits. Four divisions may be created, with each division being 400 bits. The size of second portion 502 may then be set to 400 bits to store a division of bits. Shift register 320 may be preloaded with bits 1-1600 in first portion 502, and bits 1-400 (the first division) in second portion 504. After 400 shifts, first portion 502 of shift register 320 may be loaded with bits 401-1600 and 1-400 (shifted into first portion 502 from second portion 504), and second portion 504 may be loaded with bits 401-800. After 800 shifts, first portion 502 of shift register 320 may be loaded with bits 801-1600 and 1-800, and second portion 504 may be loaded with bits 801-1200. After 1200 shifts, first portion 502 of shift register 320 may be loaded with bits 1201-1600 and 1-1200, and second portion 504 may be loaded with bits 1201-1600. In one implementation, second portion 504 is reloaded as described every 400 shifts, and first portion 502 changes according to the shifting of shift register 320. In one implementation, first portion 502 and second portion 504 are reloaded together as described to simulate continuous shifting.

Controller 130 and/or encoder 130 may identify a code rate or code length selected from a plurality of predetermined code rates or code lengths. The code rate and/or length may be identified, for example, based on a data retention scheme. For example, the code rate and/or code length may be changed after a predetermined number of program/erase cycles. In this regard, a matrix size of the matrix is determined based on the identified code rate or code length, and a bit size of the predetermined bit series, a bit size of the first portion, a bit size of the second portion, and a bit size of each division are determined based on the matrix size.

With regard to FIG. 5B, when a new code rate is selected during operation of data storage system 100, the bit size of first portion 502 and second portion 504 may automatically be reconfigured 508 to the selected code rate or code length. In the depicted example, the code length is shortened, causing a reconfiguration 508 of first portion 502 and second portion 504. The bit size of first portion 502 and second portion 504 become smaller to accommodate a shorter codeword length.

Figure 6:
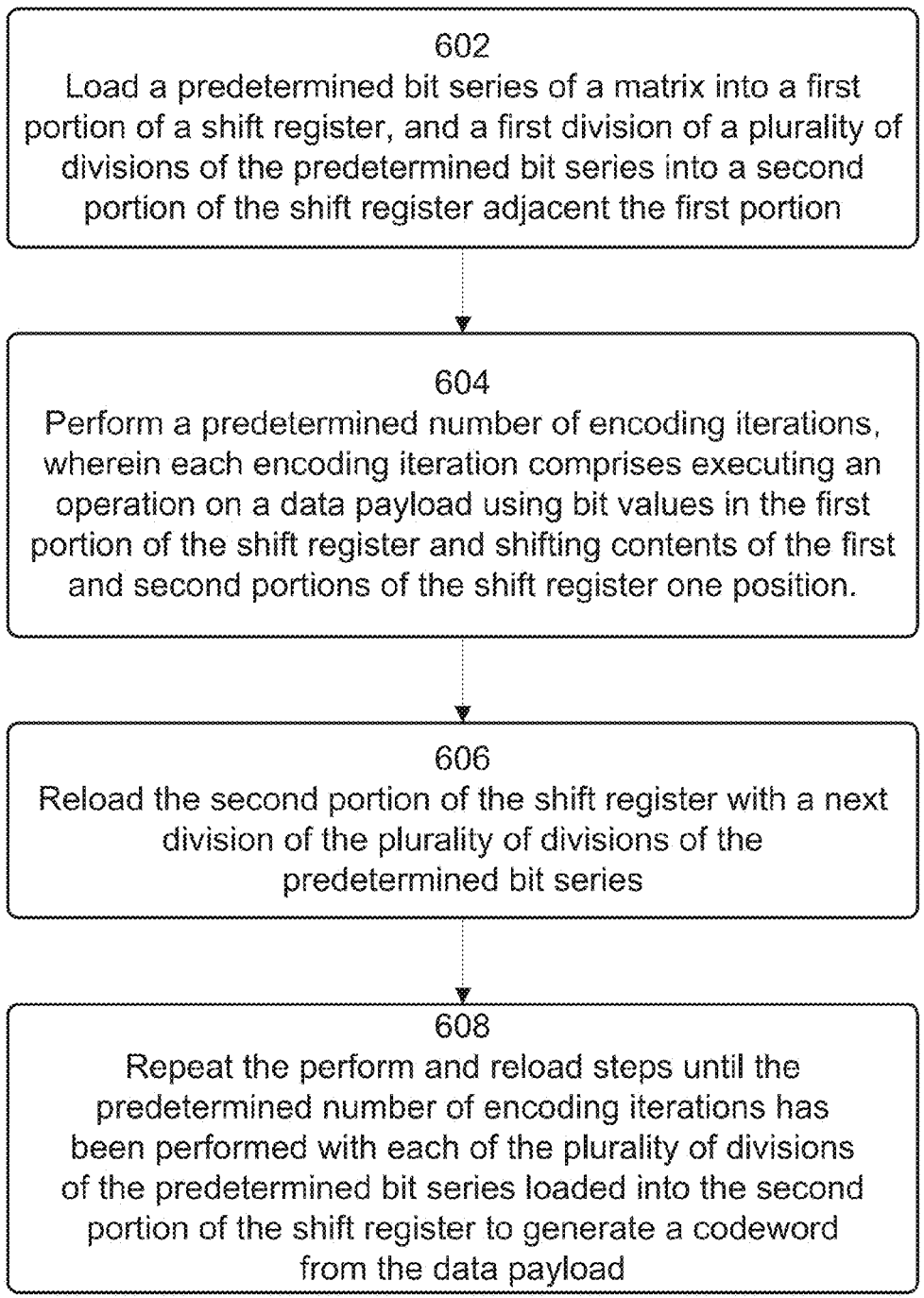
FIG. 6 depicts a flow diagram of a first example process for supporting multiple code rates and code lengths according to aspects of the subject technology.

With regard to FIG. 4, result register 350 may be used as a buffer and not required to be split into first and second portions such as in shift register 320. However, a reconfiguration 508 of first portion 502 of shift register 320 may cause a similar reconfiguration to occur in result register 350. For example, logic circuitry 330 and 340 corresponding to bit positions outside of those used by first portion 502 may be turned off and the data positions within result register 350 that do not correspond to first portion 502 may be set to null or a predetermined value. A portion of input register 310 may also store the user subsegment s, appended with data set to null or a predetermined value to offset the user subsegment so that each bit $s_1$ is positioned to be fed into the logic gates 330 at each computational cycle of the encoding process, FIG. 6 depicts a flow diagram of a first example process 600 for supporting multiple code rates and code lengths according to various aspects of the subject technology. For explanatory purposes, the various blocks of example process 600 are described herein with reference to the components and/or processes described herein. The one or more of the blocks of process 600 may be implemented, for example, by one or more processors, including, for example, controller 130 of FIG. 1 or one or more components or processors of controller 130. In some implementations, one or more of the blocks may be implemented apart from other blocks, and by one or more different processors or controllers. Further for explanatory purposes, the blocks of example process 600 are described as occurring in serial, or linearly. However, multiple blocks of example process 600 may occur in parallel. In addition, the blocks of example process 600 need not be performed in the order shown and/or one or more of the blocks of example process 600 need not be performed. The blocks of process 600, or subset thereof, may also be executed for each memory device and/or to support multiple code lengths, depending on various operating conditions of the memory device(s).

In the depicted example, a system according to the subject technology loads a predetermined bit series of a matrix into a first portion 502 of a shift register 320, and a first division of a plurality of divisions of the predetermined bit series into a second portion 504 of the shift register adjacent the first portion (602). The predetermined bit series may be loaded by controller 130, and the matrix may be stored in non-volatile memory array 150, in data storage memory 132 (e.g., in RAM) within controller 130, or on a magnetic media storage 160. The matrix may be a generator matrix, and the predetermined bit series may be a row or column of a circulant of the generator matrix.

A predetermined number of encoding iterations are performed (604), for example, by Encoder 300. Each encoding iteration comprises executing an operation on a data payload (e.g., from host system 110) using bit values in the first portion of shift register 320 and shifting contents of the first and second portions of the shift register one position.

Second portion 504 of the shift register 320 is reloaded with a next division of the plurality of divisions of the predetermined bit series (606). In one or more implementations, the predetermined number of encoding iterations is equal to the bit size of second portion 504, and second portion 504 is reloaded with the next division after the predetermined number of encoding iterations are performed. The predetermined bit series may be stored in a memory, such as data storage memory 132. For example, the memory may store a bit series for each submatrix 228 so that the generator matrix may be replicated by the shifting of the bit series during operation of data storage system 100. In some implementations, the memory may store the entire matrix.

In one or more implementations, more than one or all of the divisions may be reloaded at the same time, or after the predetermined number of encoding iterations are performed. For example, first portion 502 and second portion 504 of shift register 320 may be loaded with respective divisions of the predetermined bit series arranged such that first portion 502 is populated with the predetermined bit series in a circularly-shifted state according to a predetermined number of shifts equal to the bit size of second portion 504.

The performing and reloading steps are then repeated (608) until the predetermined number of encoding iterations has been performed with each of the plurality of divisions of the predetermined bit series loaded into second portion 504 to generate a codeword from the data payload. In this regard, the performing, reloading, and repeating steps may operate to simulate circular shifting of the predetermined bit series within first portion 502 of shift register 320.

Figure 7:
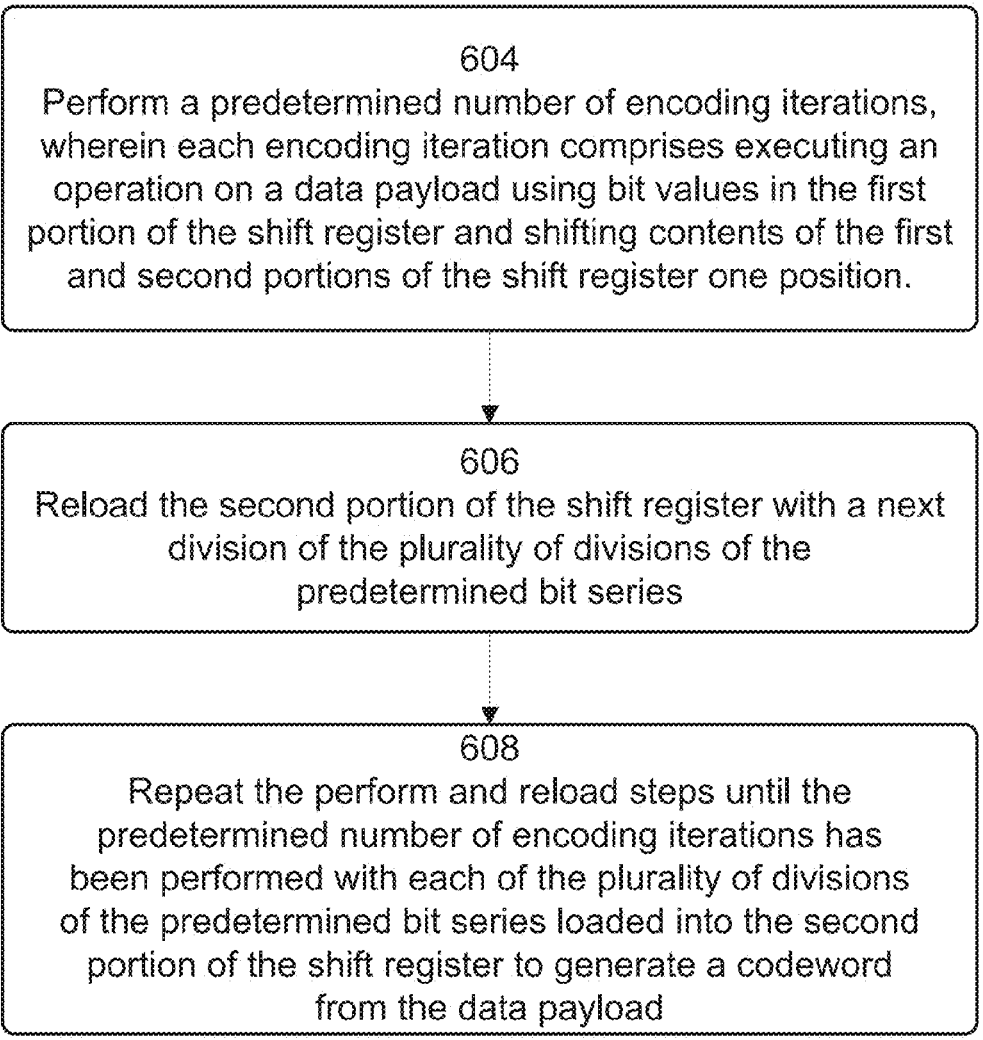
FIG. 7 depicts a flow diagram of a second example process for supporting multiple code rates and code lengths according to aspects of the subject technology.

FIG. 7 depicts a flow diagram of a second example process 700 for supporting multiple code rates and code lengths according to various aspects of the subject technology. For explanatory purposes, the various blocks of example process 700 are described herein with reference to the components and/or processes described herein. The one or more of the blocks of process 700 may be implemented, for example, by one or more processors, including, for example, controller 130 of FIG. 1 or one or more components or processors of controller 130. In some implementations, one or more of the blocks may be implemented apart from other blocks, and by one or more different processors or controllers. Further for explanatory purposes, the blocks of example process 700 are described as occurring in serial, or linearly. However, multiple blocks of example process 700 may occur in parallel. In addition, the blocks of example process 700 need not be performed in the order shown and/or one or more of the blocks of example process 700 need not be performed. The blocks of process 700, or subset thereof, may also be executed for each memory device and/or to support multiple code lengths, depending on various operating conditions of the memory device(s).

In the depicted example, the system according to the subject technology identifies a code rate or code length selected from a plurality of predetermined code rates or code lengths (702). A matrix size of the matrix is determined based on the identified code rate or code length (704). A bit size of the predetermined bit series, a bit size of the first portion, a bit size of the second portion, and a bit size of each division, all of which were described with regard to process 600, are determined based on the matrix size (706). The bit size of first portion 502 may be equal to the bit size of the predetermined bit series, and the bit size of the second portion may be equal to the bit size of each division.

The above steps of processes 600 and 700 may be performed by controller 130, utilizing data storage memory 132 and encoder 300. Many of the above-described features of example processes 600 and 700 and related features and applications, may be implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In one or more example implementations, the size of first portion 502 and second portion 504 of shift register 320 may be selected in accordance with a desired code rate, and the code rate selected based on a desired data throughput. The number of divisions of the matrix bit series selected may be a number of submatrices in the generator matrix. The number of divisions selected may be equal to the row weight of the generator matrix. In one or more example implementations, code rate of the encoder 300 may be selected based on the combination of the number of submatrices and the value of P. In some implementations, a code rate of the encoder 300 may be selected based on the combination of the values of X and P. Parity data may be determined in parallel or substantially in parallel using all submatrices.

Utilizing the encoder supporting multiple code rates as is disclosed herein may provide for flexible and scalable encoding of user data, particularly when QC-LDPC encoding is used. The size of the shift register used by the encoder may be scaled in size based on, for example, the desired code rate, code length, encoding throughput and/or computational cycle duration. The encoder architecture is particularly suited to generate codewords of different code rates and/or lengths without requiring a shift register for each code rate or code length. Accordingly, encoding speed and efficiency and system performance is improved.

Those skilled in the art will appreciate that in some example implementations, other suitable error correction mechanisms may be used in addition to and/or in place of LDPC coding. For example, Hamming coding, Reed-Solomon coding, BCH coding, and the like may be used. Further, user data may encompass data provided by a host system, data generated internally by a data storage system, etc., and/or a combination thereof. Also, any suitable unit or grouping of data, such as octet, nibble, word, byte, etc., may be used in addition to or in place of a bit of user data. Moreover, when code shortening techniques are utilized, encoding may be partially or fully skipped. The actual steps taken in the disclosed processes, such as the processes illustrated in FIG. 7, may differ from those shown in the figure. Additional system components may be utilized, and disclosed system components may be combined or omitted. Depending on the example implementation, certain of the steps described above may be removed, others may be added. Accordingly, the scope of the present disclosure is intended to be defined only by reference to the appended claims.

The systems and methods disclosed herein may be applied to hard disk drives, hybrid hard drives, and the like. In addition, other forms of storage (e.g., DRAM or SRAM, battery backed-up volatile DRAM or SRAM devices, EPROM, EEPROM memory, etc.) may additionally or alternatively be used. As another example, the various components illustrated in the figures may be implemented as software and/or firmware on a processor, ASIC/FPGA, or dedicated hardware. Also, the features and attributes of the specific example implementations disclosed above may be combined in different ways to form additional example implementations, all of which fall within the scope of the present disclosure. Although the present disclosure provides certain preferred example implementations and applications, other example implementations that are apparent to those of ordinary skill in the art, including example implementations which do not provide all of the features and advantages set forth herein, are also within the scope of this disclosure. Accordingly, the scope of the present disclosure is intended to be defined only by reference to the appended claims.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject technology.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §12, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A method of encoding, comprising:
    loading a predetermined bit series of a matrix into a first portion of a shift register, and a first division of a plurality of divisions of the predetermined bit series into a second portion of the shift register adjacent the first portion;
    performing a predetermined number of encoding iterations, wherein each encoding iteration comprises executing an operation on a data payload using bit values in the first portion of the shift register and shifting contents of the first and second portions of the shift register one position;
    reloading the second portion of the shift register with a next division of the plurality of divisions of the predetermined bit series; and
    repeating the performing and reloading steps until the predetermined number of encoding iterations has been performed with each of the plurality of divisions of the predetermined bit series loaded into the second portion of the shift register to generate a codeword from the data payload.

2. The method of claim 1, further comprising:
    identifying a code rate selected from a plurality of predetermined code rates;
    determining a matrix size of the matrix based on the identified code rate; and
    setting a bit size of the predetermined bit series, a bit size of the first portion, a bit size of the second portion, and a bit size of each division based on the matrix size,
    wherein the bit size of the first portion is equal to the bit size of the predetermined bit series, and the bit size of the second portion is equal to the bit size of each division.

3. The method of claim 2, wherein the matrix is a generator matrix, and the predetermined bit series is a row or column of a circulant of the generator matrix.

4. The method of claim 2, wherein the predetermined number of encoding iterations is equal to the bit size of the second portion, and wherein the second portion is reloaded with the next division after the predetermined number of encoding iterations are performed.

5. The method of claim 4, wherein the predetermined bit series is stored in a memory, and wherein the reloading comprises:
    reloading the first and second portions of the shift register with respective divisions of the predetermined bit series arranged such that the first portion of the shift register is populated with the predetermined bit series in a circularly-shifted state according to a predetermined number of shifts equal to the bit size of the second portion.

6. The method of claim 2, wherein the shift register comprises a third portion, wherein a bit size of the third portion is a bit size of the shift register less the bit size of the first portion and the bit size of the second portion.

7. The method of claim 6, wherein the performing, reloading, and repeating steps operate to simulate a circular shifting of the predetermined bit series within the first portion of the shift register.

8. A data encoding system, comprising:
a controller configured to identify a predetermined code size for host data received from a host system;
a memory storing at least a portion of a matrix for the predetermined code size;
a shift register; and
a controller configured to:
load a predetermined bit series of the matrix into a first portion of the shift register, and a first division of a plurality of divisions of the predetermined bit series into a second portion of the shift register adjacent to the first portion;
perform a predetermined number of encoding iterations, wherein each encoding iteration comprises executing an operation on a data payload using bit values in the first portion of the shift register and shifting contents of the first and second portions of the shift register one position;
reload the second portion of the shift register with a next division of the plurality of divisions of the predetermined bit series; and
repeat the perform and reload steps until the predetermined number of encoding iterations has been performed with each of the plurality of divisions of the predetermined bit series loaded into the second portion of the shift register to generate a codeword from the data payload.

9. The data encoding system of claim 8, wherein the predetermined code size is identified from a plurality of predetermined code sizes, wherein the controller is further configured to:
determine a matrix size of the matrix based on the identified code size; and
set a bit size of the predetermined bit series, a bit size of the first portion, a bit size of the second portion, and a bit size of each division based on the matrix size,
wherein the bit size of the first portion is equal to the bit size of the predetermined bit series; and the bit size of the second portion is equal to the bit size of each division.

10. The data encoding system of claim 9, wherein the matrix is a generator matrix, and the bit series is a row or column of a circulant of the generator matrix.

11. The data encoding system of claim 9, wherein the predetermined number of encoding iterations is equal to the bit size of the second portion, and wherein the second portion is reloaded with the next division after the predetermined number of encoding iterations are performed.

12. The data encoding system of claim 9, wherein the predetermined bit series is stored in a memory, and wherein the being configured to reload comprises the controller being configured to:
reload the first and second portions of the shift register with respective divisions of the predetermined bit series arranged such that the first portion of the shift register is populated with the predetermined bit series in a circularly-shifted state according to a predetermined number of shifts equal to the bit size of the second portion.

13. The data encoding system of claim 9, wherein the shift register comprises a third portion, wherein a bit size of the third portion is a bit size of the shift register less the bit size of the first portion and the bit size of the second portion.

14. The data encoding system of claim 13, wherein the performing, reloading, and repeating steps operate to simulate a circular shifting of the predetermined bit series within the first portion of the shift register.

15. A non-transitory machine-readable medium comprising instructions thereon that, when executed, cause an encoding module to perform a method comprising:
loading a predetermined bit series of a matrix into a first portion of a shift register, and a first division of a plurality of divisions of the predetermined bit series into a second portion of the shift register adjacent the first portion;
performing a predetermined number of encoding iterations, wherein each encoding iteration comprises executing an operation on a data payload using bit values in the first portion of the shift register and shifting contents of the first and second portions of the shift register one position;
reloading the second portion of the shift register with a next division of the plurality of divisions of the predetermined bit series; and
repeating the performing and reloading steps until the predetermined number of encoding iterations has been performed with each of the plurality of divisions of the predetermined bit series loaded into the second portion of the shift register to generate a codeword from the data payload.

16. The non-transitory machine-readable medium of claim 15, wherein the method further comprises:
identifying a code rate selected from a plurality of predetermined code rates;
determining a matrix size of the matrix based on the identified code rate; and
setting a bit size of the predetermined bit series; a bit size of the first portion, a bit size of the second portion, and a bit size of each division based on the matrix size,
wherein the bit size of the first portion is equal to the bit size of the predetermined bit series, and the bit size of the second portion is equal to the bit size of each division.

17. The non-transitory machine-readable medium of claim 16, wherein the matrix is a generator matrix, and the bit series is a row or column of a circulant of the generator matrix.

18. The non-transitory machine-readable medium of claim 16, wherein the predetermined number of encoding iterations is equal to the bit size of the second portion, and wherein the second portion is reloaded with the next division after the predetermined number of encoding iterations are performed.

19. The non-transitory machine-readable medium of claim 16, wherein the predetermined bit series is stored in a memory, and wherein the reloading comprises:
reload the first and second portions of the shift register with respective divisions of the predetermined bit series arranged such that the first portion of the shift register is populated with the predetermined bit series in a circularly-shifted state according to a predetermined number of shifts equal to the bit size of the second portion.

20. The non-transitory machine-readable medium of claim 19, wherein the shift register comprises a third portion, wherein a bit size of the third portion is a bit size of the shift register less the bit size of the first portion and the bit size of the second portion.

21. A system, comprising:
- a means for loading a predetermined bit series of a matrix into a first portion of a shift register, and a first division of a plurality of divisions of the predetermined bit series into a second portion of the shift register adjacent the first portion;
- a means for performing a predetermined number of encoding iterations, wherein each encoding iteration comprises executing an operation on a data payload using bit values in the first portion of the shift register and shifting contents of the first and second portions of the shift register one position;
- a means for reloading the second portion of the shift register with a next division of the plurality of divisions of the predetermined bit series; and
- a means for repeating the performing and reloading steps until the predetermined number of encoding iterations has been performed with each of the plurality of divisions of the predetermined bit series loaded into the second portion of the shift register to generate a codeword from the data payload.

22. The system of claim 21, further comprising:
- a means for identifying a code rate selected from a plurality of predetermined code rates;
- a means for determining a matrix size of the matrix based on the identified code rate; and
- a means for setting a bit size of the predetermined bit series, a bit size of the first portion, a bit size of the second portion, and a bit size of each division based on the matrix size,
- wherein the bit size of the first portion is equal to the bit size of the predetermined bit series, and the bit size of the second portion is equal to the bit size of each division.

* * * * *